(12) United States Patent
Rendek, Jr.

(10) Patent No.: US 10,194,536 B2
(45) Date of Patent: Jan. 29, 2019

(54) METHOD OF MAKING AN ELECTRONIC DEVICE HAVING A THIN FILM RESISTOR FORMED ON AN LCP SOLDER MASK AND RELATED DEVICES

(71) Applicant: HARRIS CORPORATION, Melbourne, FL (US)

(72) Inventor: Louis Joseph Rendek, Jr., Melbourne, FL (US)

(73) Assignee: HARRIS CORPORATION, Melbourne, FL (US)

( * ) Notice: Subject to any disclaimer, the term of this patent is extended or adjusted under 35 U.S.C. 154(b) by 0 days.

(21) Appl. No.: 15/704,291

(22) Filed: Sep. 14, 2017

(65) Prior Publication Data

US 2018/0007797 A1    Jan. 4, 2018

Related U.S. Application Data

(62) Division of application No. 15/346,043, filed on Nov. 8, 2016, now Pat. No. 9,795,039, which is a division
(Continued)

(51) Int. Cl.
*H05K 1/16* (2006.01)
*H05K 3/34* (2006.01)
(Continued)

(52) U.S. Cl.
CPC .......... *H05K 3/3452* (2013.01); *H05K 1/028* (2013.01); *H05K 1/03* (2013.01); *H05K 1/111* (2013.01); *H05K 1/115* (2013.01); *H05K 1/167* (2013.01); *H05K 3/16* (2013.01); *H05K 3/3436* (2013.01); *H05K 3/4038* (2013.01);

*H01L 2224/16225* (2013.01); *H05K 1/0393* (2013.01); *H05K 2201/0141* (2013.01); *H05K 2201/05* (2013.01); *Y02P 70/613* (2015.11)

(58) Field of Classification Search
CPC ... H05K 1/02; H05K 1/03; H05K 1/11; H05K 1/16; H05K 1/18; H05K 3/00; H05K 3/10; H05K 3/12; H05K 3/18; H05K 3/46; H01C 1/02; H01C 1/28
USPC .......... 174/254, 257, 258, 261; 156/81, 213; 338/309; 428/182
See application file for complete search history.

(56) References Cited

U.S. PATENT DOCUMENTS 3,761,860 A    9/1973  Ogasawara et al.
5,274,352 A    12/1993 Nishikawa et al.
(Continued)

FOREIGN PATENT DOCUMENTS

KR    1020020030903    4/2002
KR    1020060111962    10/2006
KR    1020120126241    11/2012

*Primary Examiner* — Xiaoliang Chen
(74) *Attorney, Agent, or Firm* — Allen, Dyer, Doppelt + Gilchrist, P.A.

(57) ABSTRACT

A method of making an electronic device may include forming at least one circuit layer that includes solder pads on a substrate and forming at least one liquid crystal polymer (LCP) solder mask having mask openings therein. The method may also include forming at least one thin film resistor on the LCP solder mask and coupling the at least one LCP solder mask to the substrate so that the at least one thin film resistor is coupled to the at least one circuit layer and so that the solder pads are aligned with the mask openings.

5 Claims, 5 Drawing Sheets

Related U.S. Application Data of application No. 14/490,866, filed on Sep. 19, 2014, now Pat. No. 9,521,752.

(51) Int. Cl.
    *H05K 3/16*     (2006.01)
    *H05K 1/02*     (2006.01)
    *H05K 1/11*     (2006.01)
    *H05K 3/40*     (2006.01)
    *H05K 1/03*     (2006.01)

(56) References Cited

U.S. PATENT DOCUMENTS

| | | | |
|---|---|---|---|
| 5,874,770 A | 2/1999 | Saia et al. | |
| 6,239,482 B1* | 5/2001 | Fillion | H01L 23/13 257/678 |
| 6,242,282 B1* | 6/2001 | Fillion | H01L 21/4853 257/E21.508 |
| 7,202,552 B2 | 4/2007 | Zhe et al. | |
| 8,472,207 B2 | 6/2013 | Rendek, Jr. et al. | |
| 8,693,203 B2 | 4/2014 | Rendek, Jr. et al. | |
| 8,932,474 B1 | 1/2015 | Cok | |
| 9,161,456 B1 | 10/2015 | Cok et al. | |
| 2002/0182374 A1* | 12/2002 | Tung | H05K 1/162 428/182 |
| 2003/0102076 A1 | 6/2003 | Johnston et al. | |
| 2003/0104170 A1 | 6/2003 | Johnston et al. | |
| 2003/0150101 A1* | 8/2003 | Park | H01B 1/22 29/621 |
| 2003/0162386 A1* | 8/2003 | Ogawa | H01L 21/4846 438/637 |
| 2004/0108937 A1* | 6/2004 | Ernsberger | H01C 1/028 338/309 |
| 2005/0082671 A1* | 4/2005 | Ernsberger | H01C 1/028 257/737 |
| 2005/0175385 A1* | 8/2005 | Cho | H05K 1/167 400/209 |
| 2005/0196966 A1* | 9/2005 | Su | H01C 7/006 438/700 |
| 2007/0085654 A1 | 4/2007 | Bhattacharya et al. | |
| 2007/0124918 A1* | 6/2007 | Su | H01C 7/006 29/610.1 |
| 2009/0084595 A1* | 4/2009 | Park | H05K 3/281 174/261 |
| 2010/0289132 A1* | 11/2010 | Huang | H01L 21/4846 257/690 |
| 2011/0139499 A1* | 6/2011 | Park | H05K 3/281 174/258 |
| 2011/0308720 A1 | 12/2011 | Yoneyama | |
| 2012/0062346 A1* | 3/2012 | Mckinzie, III | H01P 1/16 333/251 |
| 2012/0181073 A1* | 7/2012 | Rendek, Jr. | H05K 1/186 174/258 |
| 2012/0182701 A1* | 7/2012 | Weatherspoon | H05K 1/189 361/750 |
| 2012/0182702 A1* | 7/2012 | Rendek, Jr. | H05K 3/281 361/750 |
| 2012/0182703 A1* | 7/2012 | Rendek, Jr. | H01L 23/49894 361/750 |
| 2013/0215578 A1 | 8/2013 | Stronks et al. | |
| 2013/0249073 A1* | 9/2013 | Chen | H01L 23/3128 257/706 |
| 2014/0138849 A1* | 5/2014 | Rendek, Jr. | H01L 23/49894 257/774 |
| 2014/0217618 A1* | 8/2014 | King | H01L 23/498 257/783 |
| 2014/0308435 A1 | 10/2014 | Burberry et al. | |
| 2014/0321089 A1* | 10/2014 | Rendek, Jr. | H05K 1/03 361/767 |
| 2014/0322436 A1 | 10/2014 | Yau et al. | |
| 2014/0376197 A1* | 12/2014 | Weatherspoon | H05K 1/189 361/750 |
| 2015/0000965 A1* | 1/2015 | Shiroshita | H05K 1/113 174/257 |
| 2015/0009644 A1* | 1/2015 | Rendek, Jr. | H01L 24/83 361/767 |
| 2015/0013901 A1* | 1/2015 | Rathburn | H05K 3/0005 156/277 |
| 2015/0060111 A1 | 3/2015 | Cok | |
| 2015/0060393 A1 | 3/2015 | Cok | |
| 2015/0084200 A1 | 3/2015 | Cok | |
| 2015/0084201 A1 | 3/2015 | Cok | |
| 2015/0085456 A1 | 3/2015 | Cok | |

\* cited by examiner

METHOD OF MAKING AN ELECTRONIC DEVICE HAVING A THIN FILM RESISTOR FORMED ON AN LCP SOLDER MASK AND RELATED DEVICES

FIELD OF THE INVENTION

The present invention relates to the field of electronic devices fabrication, and more particularly, to a method of making an electronic device that includes a liquid crystal polymer solder mask and related devices.

BACKGROUND

It may be particularly desirable to reduce the size of a mobile wireless communications device, for example, to a thinner form factor. Reducing the sire of a device generally requires thinner substrates and components coupled to the substrates. Additionally, it may also be desirable to reduce fabrication costs, for example, by providing a simpler fabrication process. For example, one approach to reducing substrate fabrication costs may include the use of a double-sided flexible substrate and a solder mask or coverlay, as a less expensive option compared to a multilayer flexible substrate and a coverlay.

Additionally, increased use of relatively high frequency radar devices in the automotive industry (e.g., parking sensors, backup sensors, blind spot sensors, etc.) coupled with the desire for non-hermetic packaging driven by high volume cost concerns may also increase the desire for lightweight, low cost, high frequency capable packaging and substrate materials. Liquid crystal polymer (LCP) may be considered one such material, for example.

The use of thinner components may generally require the use of a higher percentage of bare die and/or flip chip components, for example. Accordingly, mounting those components to a substrate without increasing fabrication costs may be increasingly a concern. Ultrathin flexible circuits with reduced thickness active and passive components may thus be used to address this concern. Thin film passive devices, for example thin film resistors, have generally been available for several decades. However, a thin film passive device typically must he embedded within a multilayer printed circuit board (PCB), which may not be possible, for example, with certain flexible circuits.

Existing coverlay materials for flexible circuits generally require an adhesive-based bonding that includes relatively large apertures to be opened around pads for subsequent electrical interconnection between the flexible circuit and the electronic assembly. These coverlay materials hence generally allow for the addition of little if any additional functionality outside of protection of the underlying features on the flex circuit. Accordingly, additional fabrication methods to include additional device functionality are needed.

SUMMARY

A method of making an electronic device may include forming at least one circuit layer that may include a plurality of solder pads on a substrate and forming at least one liquid crystal polymer (LCP) solder mask having a plurality of mask openings therein. The method may also include forming at least one thin film resistor on the LCP solder mask and coupling the at least one LCP solder mask to the substrate so that the at least one thin film resistor is coupled to the at least one circuit layer and so that the plurality of solder pads is aligned with the plurality of mask openings. Accordingly, the thickness of the electronic device may be reduced while maintaining functionality and robustness.

The at least one LCP solder mask may be coupled to the substrate so that the at least one thin film resistor is sandwiched between the at least one LCP solder mask and the substrate, for example. Forming the at lease one circuit layer may include forming a plurality of circuit layers carried by opposing surfaces of the substrate, and forming the at least one LCP solder mask may include forming a plurality of LCP solder masks. Forming the at least one thin film resistor may include forming at least one thin film resistor on each of the plurality of LCP solder masks, and each of the plurality of LCP solder masks may be coupled to the opposing surfaces of the substrate, for example. Each LCP solder mask may be coupled to a respective one of the surfaces of the substrate so that the plurality of thin film resistors are sandwiched between the plurality of LCP solder masks and the substrate.

The at least one thin film resistor may be formed on the LCP solder mask by sputtering, for example. The method may further include attaching a circuit component to corresponding solder pads of the plurality thereof.

The method may further include forming at least one electrically conductive via through the substrate. The substrate may include an LCP substrate, for example. The substrate may include a flexible printed circuit board (PCB).

A device aspect is directed to an electronic device that may include a substrate and at least one circuit layer that includes a plurality of solder pads carried by the substrate. The electronic device also includes at least one liquid crystal polymer (LCP) solder mast having a plurality of mask openings therein and at least one thin film resistor carried by the LCP solder mask. The at least one LCP solder mask may be directly coupled to the substrate without an adhesive layer so that the at least one thru film resistor is directly coupled to the at least one circuit layer and so that the plurality of solder pads is aligned with the plurality of mask openings.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
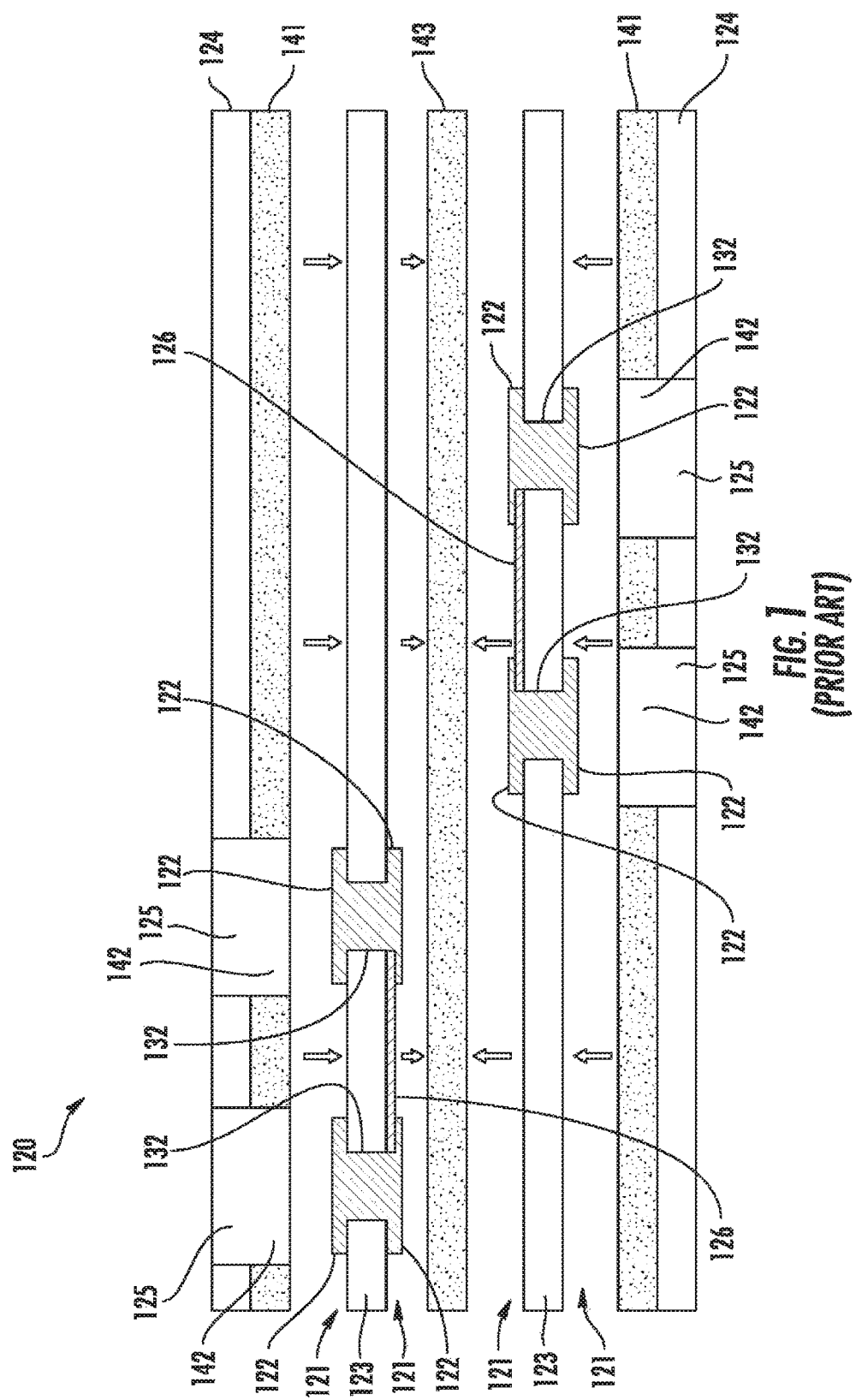
FIG. 1 is an exploded view schematic diagram of part of an electronic device in accordance with the prior art.
Figure 2:
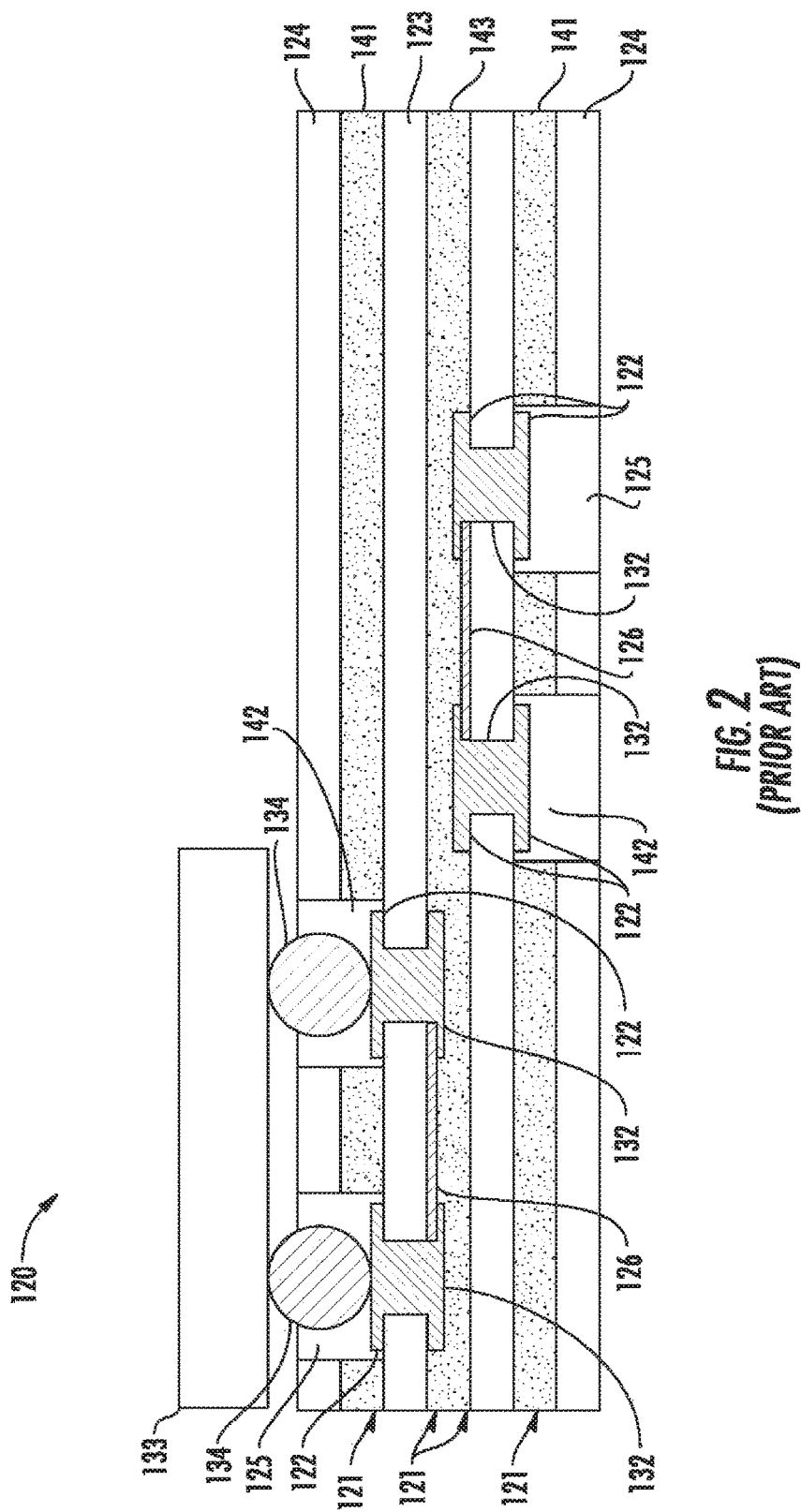
FIG. 2 is an assembled schematic diagram of a part of the electronic device of FIG. 1.

Referring initially to FIGS. 1 and 2, an electronic device 120 made according to a prior art approach is now described.

Circuit layers 121 that each include solder pads 122 are carried by a substrate 123. Electrically conductive vias 132 expend through the substrate 123 and couple solder pads 122 on opposing surfaces of the substrate. An adhesive layer 141 is carried by the substrate 123 and has openings 142 therein. A solder mask 124 or coverlay that has mask openings 125 therein is carried by the adhesive layer 141. The mask openings 125 are aligned with the adhesive layer openings 142.

The circuit layers 121 each include a thin film resistor 126 carried by the substrate 123 coupled to corresponding solder pads 122. Each thin film resistor 126 is typically formed on a copper substrate, for example, and coupled within the corresponding circuit layer 121, including the copper substrate, during multilayer lamination. Because it is highly desirable that each thin film resistor 126 be protected or embedded, another adhesive layer, for example in the form of a bonding film layer 143, is formed or coupled over each thin film resistor. In other words, it is highly desirable that each thin film resistor 126 be embedded. In this case, the bonding film layer 143 is sandwiched between adjacent substrates 123, or more particularly, adjacent circuit layers 121. A circuit component 133 is coupled to corresponding solder pads 122, for example, using solder 134.

A disadvantage of the prior art approach described with respect to FIGS. 1 and 2 is that to achieve the desired protection or embedding of the thin film resistors 126, multiple layers are used, for example, the adhesive and bonding film layers 141, 143 and two substrates 123. Thus, these layers increase the overall size of the electronic device 120.

Figure 3:
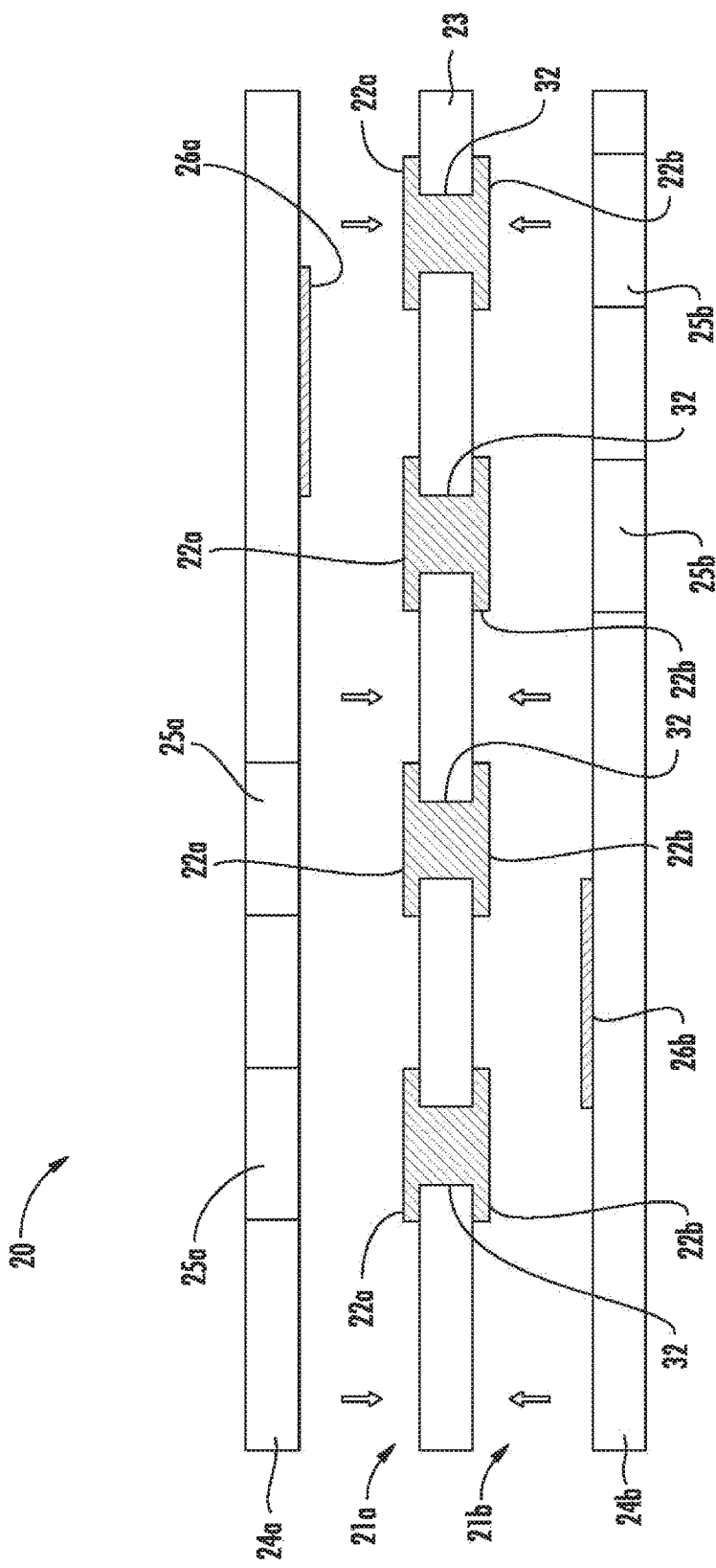
FIG. 3 is an exploded view schematic diagram of part of an electronic device in accordance with the present invention.
Figure 4:
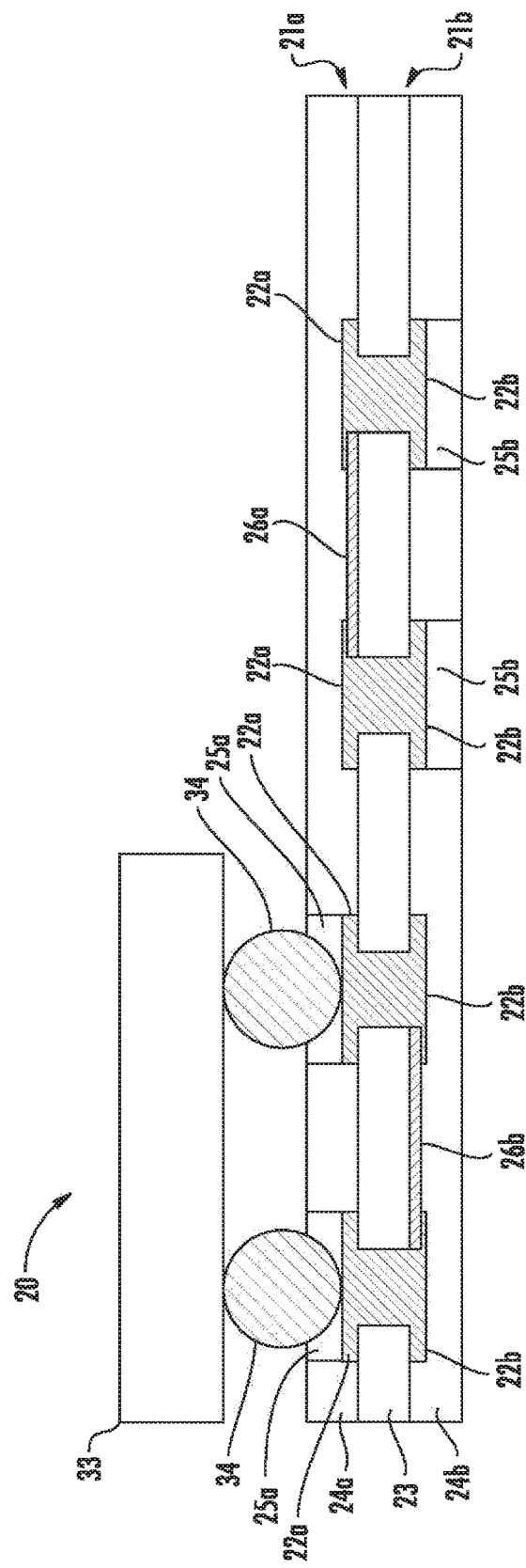
FIG. 4 is an assembled schematic diagram of a part of the electronic device of FIG. 3.
Figure 5:
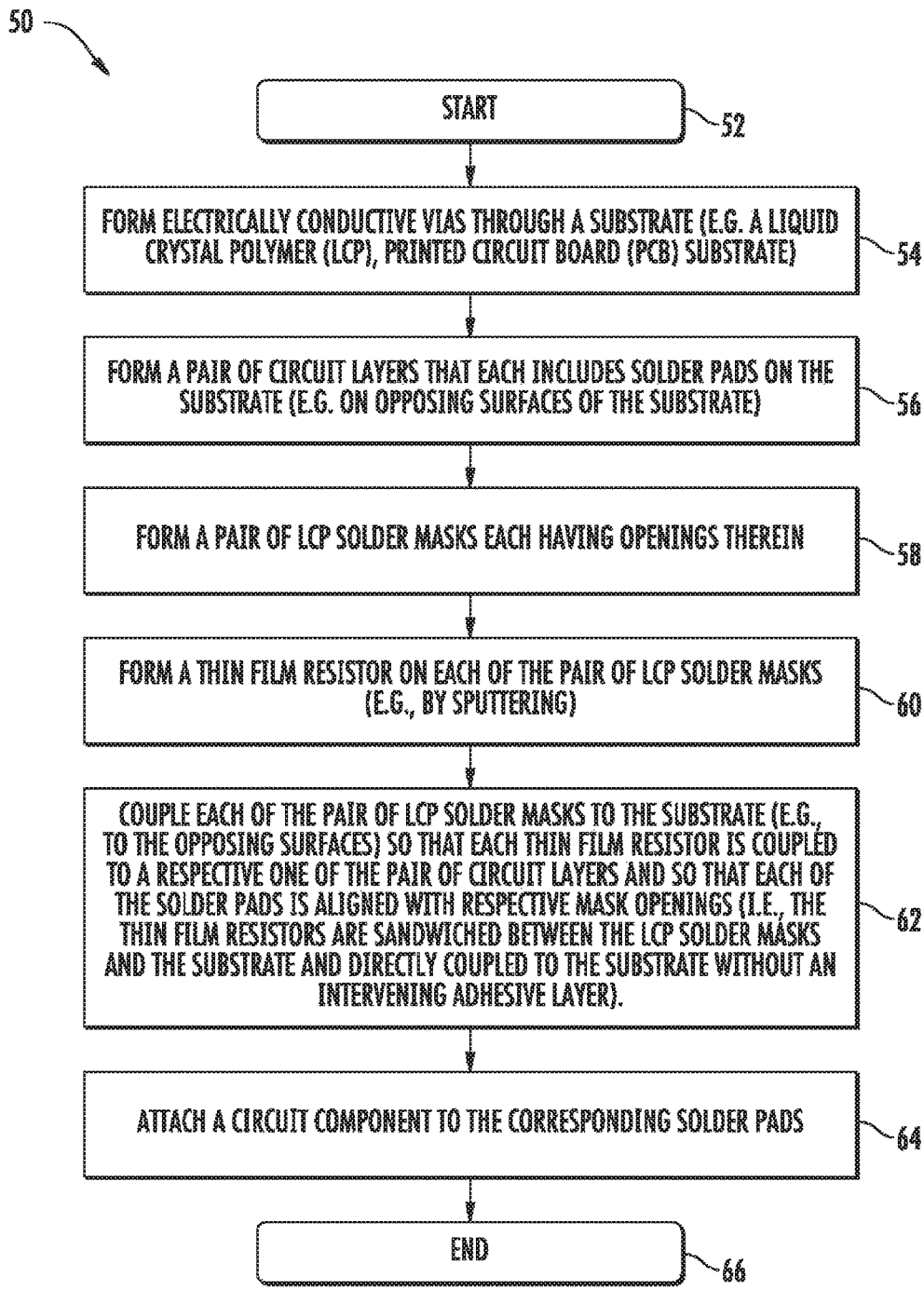
FIG. 5 is a flowchart of a method of making the electronic device in FIG. 4.

Referring initially to FIGS. 3 and 4, and the flowchart 50 in FIG. 5, beginning at Block 52, a method of making an electronic device 20 is described. The method includes, at Block 54, forming electrically conductive vias 32 through a substrate 23. At Block 56, the method also includes forming a pair of circuit layers 21a, 21b that each includes solder pads 22a, 22b on opposing surfaces of the substrate 23. The substrate 23 may be a liquid crystal polymer (LCP) substrate, for example. The substrate 23 may alternatively or additionally be a flexible printed circuit board (PCB). Of course, the substrate 23 may be another type of substrate, for example.

The method also includes forming a pair of LCP solder masks 24a, 24b or coverlays each having mask openings 25a, 25b or apertures therein (Block 58). The LCP solder masks 24a, 24b may be formed according to any of a number of techniques as will be appreciated by those skilled in the art. Moreover, while a pair of LCP solder masks 24a, 24b is illustrated, it will be appreciated that any number of LCP solder masks may be used.

At Block 60, the method also includes forming a thin film resistor 26a, 26b on each of the LCP solder masks 24a, 24b. Each thin film resistor 25a, 26b may include nickel and chromium, e.g., nichrome, amongst other materials (e.g., SiCr, TaN, NiCrAlSi, etc.). It should be appreciated that while two thin film resistors 26a, 26b are illustrated, any number of thin film resistors may be formed on each of the LCP solder masks 24a, 24b. Each thin film resistor 26a, 26b may be formed on the respective LCP solder mask 24a, 24b by sputtering, for example. Of course, each thin film resistor 26a, 26b may be formed on the LCP solder mask 24a, 24b by different or other techniques as will be appreciated by those skilled in the art.

The method further includes, at Block 62, coupling each of the pair of LCP solder masks 24a, 24b to the opposing surfaces the substrate 23 so that each thin film resistor 26a, 26b is coupled to a respective one of the pair of circuit layers 21a, 21b and so that each of the solder pads 22a, 22b is aligned with respective mask openings 25a, 25b. More particularly, each LCP solder mask 24a, 24b is coupled to a respective one of the surfaces of the substrate 23 so that the thin film resistors 26a, 26b are sandwiched between the LCP solder masks and the substrate. In other words, the LCP solder masks 24a, 24b are directly coupled to the substrate 23 without an intervening adhesive layer.

At Block 64, the method also includes attaching a circuit component 33 to corresponding solder pads 22a. The circuit component may be an integrated circuit (IC), for example. The circuit component 33 may be another type of circuit component as will be appreciated by those skilled in the art. The circuit component may be coupled to the respective solder pads 22a with solder 34, for example, solder balls. The method ends at Block 66.

Indeed, relative to the prior art electronic device 120, the thickness of the electronic device 20 is significantly reduced in that the electronic device includes one, instead of two, substrates 23 and circuit layers 21, does not include a bonding film layer 143, and does not include an adhesive layer 141. Thus, the forming of the thin film resistors 26 on the LCP solder mask 24 may be considered to make the LCP solder mask 24 functional as the thin film resistor is formed directly on the LCP solder mask.

A device aspect is directed to an electronic device 20 that includes a substrate 23 and at least one circuit layer 21a, 21b that includes a plurality or solder pads 22a, 22b carried oy the substrate. The electronic device 20 also includes at least one liquid crystal polymer (LCP) solder mask 24a, 24b having a plurality of mask openings 25a, 25b therein and at least one thin film resistor 26a, 26b carried by the LCP solder mask. The at least one LCP solder mask 24a, 24b is also directly coupled to the substrate 23 without an adhesive layer so that the at least one thin film resistor 26a, 26b is directly coupled to the at least one circuit layer 21a, 21b and so that the plurality of solder pads 22a, 22b is aligned with the plurality of mask openings 25a, 25b.

As will be appreciated by those skilled in the art, the electronic device 20 made by the method described herein may be particularly advantageous for ultrathin electronic substrates, such as those used in mobile phones and tablets where thinning may be highly desirable. Indeed, the method described herein provides an adhesive-less bonding mechanism, which supports the increased functionality of the LCP solder mask 24a, 24b or coverlay. For example, the electronic device 20 made by the method described herein may achieve near hermiticity, relatively high tensile strength and abrasion resistance which may serve to protect the underlying thin film resistors from damage while providing stability of resistor values, for example, commonly in the range of 25 Ohms per square (OPS) to 150 OPS. Increased density signal routing and 3D integration may also result, as well as increased wideband dielectric properties that generally do not change upon exposure to moisture. With respect to the coefficient of thermal expansion (CTE), the electronic device made according to the method described herein may be relatively compatible with the most common integrated circuit die materials, and may generally be chemically inert and biocompatible within the human body, for example.

Further details of an electronic device having an LCP solder mask and related methods may be found in U.S. Pat. Nos. 8,693,203 and 8,472,207 and U.S. Patent Application Publication No. 2012/0182702, all of which are assigned to the assignee of the present application, have a common inventor, and all of which are hereby incorporated by reference in their entirety.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method of making an electronic device comprising:
    forming a pair of circuit layers each comprising a plurality of solder pads on opposing major surfaces of a liquid crystal polymer (LCP) substrate;
    forming a pair of LCP solder masks each having opposing first and second major surfaces and a plurality of mask openings extending therebetween;
    forming at least one thin film resistor directly on the first major surface of each of the pair of the LCP solder masks; and
    after forming at least one thin film resistor directly on the first major surface of each of the pair of LCP solder masks then coupling each of the pair of LCP solder masks to the opposing major surfaces of the LCP substrate so that each at least one thin film resistor is coupled to a respective one of the pair of circuit layers and so that each plurality of solder pads is aligned with a respective plurality of mask openings.

2. The method of claim 1 wherein each LCP solder mask is coupled to a respective one of the major surfaces of the LCP substrate so that the plurality of thin film resistors are sandwiched between the plurality of LCP solder masks and the LCP substrate.

3. The method of claim 1 wherein the plurality of thin film resistors is formed on the plurality of LCP solder masks by sputtering.

4. The method of claim 1 further comprising attaching a circuit component to corresponding solder pads of the plurality thereof.

5. The method of claim 1 further comprising forming at least one electrically conductive via through the LCP substrate.

* * * * *